United States Patent
Ueki

(10) Patent No.: US 10,193,336 B2
(45) Date of Patent: Jan. 29, 2019

(54) ESD PROTECTION CIRCUIT, DIFFERENTIAL TRANSMISSION LINE, COMMON MODE FILTER CIRCUIT, ESD PROTECTION DEVICE, AND COMPOSITE DEVICE

(71) Applicant: Murata Manufacturing Co., Ltd., Nagaokakyo-shi, Kyoto-fu (JP)

(72) Inventor: Noriyuki Ueki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/685,185

(22) Filed: Aug. 24, 2017

(65) Prior Publication Data

US 2017/0373492 A1 Dec. 28, 2017

Related U.S. Application Data

(63) Continuation of application No. PCT/JP2017/007009, filed on Feb. 24, 2017.

(30) Foreign Application Priority Data

Mar. 15, 2016 (JP) ................................. 2016-050655

(51) Int. Cl.
*H02H 9/00* (2006.01)
*H02H 9/04* (2006.01)
(Continued)

(52) U.S. Cl.
CPC ......... *H02H 9/044* (2013.01); *H01L 27/0288* (2013.01); *H01L 27/0641* (2013.01);
(Continued)

(58) Field of Classification Search
USPC .......................................................... 361/56
See application file for complete search history.

(56) References Cited

U.S. PATENT DOCUMENTS

| 7,085,118 B2 * | 8/2006 | Inoue | H01C 1/16 361/119 |
| 7,446,992 B2 * | 11/2008 | Terada | H03H 7/0107 361/117 |

(Continued)

FOREIGN PATENT DOCUMENTS

| JP | 05-122841 A | 5/1993 |
| JP | 2001-327069 A | 11/2001 |
| JP | 4247581 B2 | 4/2009 |
| JP | 2009-105555 A | 5/2009 |
| WO | 2015/087794 A1 | 6/2015 |

OTHER PUBLICATIONS

Official Communication issued in International Patent Application No. PCT/JP2017/007009, dated Apr. 18, 2017.

*Primary Examiner* — Ronald W Leja
(74) *Attorney, Agent, or Firm* — Keating & Bennett, LLP

(57) ABSTRACT

An ESD protection device includes a first terminal and a second terminal defining a first balanced port, a third terminal and a fourth terminal defining a second balanced port, and a ground terminal. A first coil and a third coil are provided between the first terminal and the third terminal to cancel an inductance component of a first ESD protection circuit. A second coil and a fourth coil are provided between the second terminal and the fourth terminal to cancel an inductance component of a second ESD protection circuit.

19 Claims, 17 Drawing Sheets

(51) Int. Cl.

| | | |
|---|---|---|
| *H03H 7/09* | (2006.01) | |
| *H01L 27/06* | (2006.01) | |
| *H01L 49/02* | (2006.01) | |
| *H01L 29/866* | (2006.01) | |
| *H03H 7/38* | (2006.01) | |
| *H03H 7/42* | (2006.01) | |
| *H05K 1/02* | (2006.01) | |
| *H05K 1/11* | (2006.01) | |
| *H05K 1/18* | (2006.01) | |
| *H01L 27/02* | (2006.01) | |
| *H05K 1/16* | (2006.01) | |
| *H05K 3/46* | (2006.01) | |

(52) U.S. Cl.
CPC ............ *H01L 28/10* (2013.01); *H01L 29/866* (2013.01); *H03H 7/09* (2013.01); *H03H 7/38* (2013.01); *H03H 7/427* (2013.01); *H05K 1/0245* (2013.01); *H05K 1/0259* (2013.01); *H05K 1/111* (2013.01); *H05K 1/185* (2013.01); *H05K 1/165* (2013.01); *H05K 3/4632* (2013.01); *H05K 2201/0141* (2013.01); *H05K 2201/0154* (2013.01); *H05K 2201/10174* (2013.01)

(56) References Cited

U.S. PATENT DOCUMENTS

| | | | | |
|---|---|---|---|---|
| 8,879,230 | B2* | 11/2014 | Wang | H03H 7/0138 361/118 |
| 8,999,807 | B2* | 4/2015 | Jiang | H01L 23/5227 257/E21.705 |
| 2006/0038635 | A1* | 2/2006 | Richiuso | H01F 17/0006 333/177 |
| 2011/0007438 | A1* | 1/2011 | Ito | H01F 17/0006 361/56 |
| 2011/0279935 | A1* | 11/2011 | Iwasa | H03H 7/0107 361/56 |
| 2012/0306609 | A1* | 12/2012 | Kato | H01F 17/0013 336/200 |
| 2014/0220364 | A1* | 8/2014 | Umemoto | C03C 14/00 428/434 |
| 2014/0306787 | A1* | 10/2014 | Kato | H01F 17/0013 336/105 |
| 2015/0162744 | A1* | 6/2015 | Liu | H01L 24/48 361/111 |
| 2016/0055964 | A1* | 2/2016 | Park | H05F 3/04 336/105 |
| 2016/0142031 | A1 | 5/2016 | Ueki et al. | |
| 2016/0148921 | A1* | 5/2016 | Mallikararjunaswamy | H01L 27/0259 257/491 |

\* cited by examiner

ESD PROTECTION CIRCUIT, DIFFERENTIAL TRANSMISSION LINE, COMMON MODE FILTER CIRCUIT, ESD PROTECTION DEVICE, AND COMPOSITE DEVICE

CROSS REFERENCE TO RELATED APPLICATIONS

This application claims the benefit of priority to Japanese Patent Application No. 2016-050655 filed on Mar. 15, 2016 and is a Continuation Application of PCT Application No. PCT/JP2017/007009 filed on Feb. 24, 2017. The entire contents of each application are hereby incorporated herein by reference.

BACKGROUND OF THE INVENTION

1. Field of the Invention

The present invention relates to an ESD protection circuit, a differential transmission line and a common mode filter circuit which include the ESD protection circuit, an ESD protection device, and a composite device.

2. Description of the Related Art

An apparatus that includes an electro-static discharge (ESD) protection circuit to protect a circuit connected to a high-frequency transmission line from a surge voltage entering the high-frequency transmission line is disclosed in, for example, Japanese Unexamined Patent Application Publication No. 2001-327069. An ESD protection device having a spark gap configuration in which, in a cavity provided in a multilayer body, discharge electrodes are disposed to face each other, is disclosed in Japanese Patent No. 4247581.

As disclosed in Japanese Unexamined Patent Application Publication No. 2001-327069, in an ESD protection device that uses a breakdown region where reverse-direction characteristics of a p-n junction of a Zener diode are stable, an ESD discharge starting voltage is low and a surge voltage applied to a circuit is able to be commonly reduced as compared to an ESD protection device having a spark gap configuration.

However, in such an ESD protection device including a Zener diode, a parasitic capacitance is generated in a depletion layer formed upon the application of a reverse bias voltage to a p-n junction portion of the Zener diode. At an ESD current path inside and outside the ESD protection device, an equivalent series inductance (ESL) component is present. This inductance component and the parasitic capacitance of the Zener diode form an LC series resonant circuit. That is, in a case where a transmission line is a differential transmission line including a first line and a second line, this resonant circuit is connected between the first line and the second line. The transmission characteristics of such a transmission line may be reduced under the influence of the resonant circuit.

SUMMARY OF THE INVENTION

Preferred embodiments of the present invention provide ESD protection circuits in which resonance between an inductance component generated at a path of an ESD current flowing through the ESD protection circuit and a parasitic capacitance generated at the ESD protection circuit is reduced or prevented, and also provide differential transmission lines and common mode filter circuits which include the ESD protection circuits, ESD protection devices, and composite devices.

An ESD protection circuit according to a preferred embodiment of the present invention includes a first terminal and a second terminal defining a first balanced port, a third terminal and a fourth terminal defining a second balanced port, a first ESD protection circuit that includes a first Zener diode and is connected between a ground and a first node between the first terminal and the third terminal, a second ESD protection circuit that includes a second Zener diode, is connected between the ground and a second node between the second terminal and the fourth terminal, and is symmetric or substantially symmetric with respect to the first ESD protection circuit, a first coil provided in series between the first terminal and the first node, a third coil that is cumulatively connected to the first coil and is provided in series between the third terminal and the first node, a second coil provided in series between the second terminal and the second node, and a fourth coil that is cumulatively connected to the second coil and is provided in series between the fourth terminal and the second node.

Since a mutual inductance generated by the coupling between the first coil and the third coil is an equivalent negative inductance and is connected in series to the first ESD protection circuit in the above-described configuration, an inductance component generated at the path of an ESD current flowing through the first ESD protection circuit is reduced. An inductance component generated at a path of an ESD current flowing through the second ESD protection circuit is similarly reduced. Accordingly, both of the resonant frequency of a resonant circuit including an inductance component generated at the path of an ESD current flowing through the first ESD protection circuit and a capacitance component of the first ESD protection circuit and the resonant frequency of a resonant circuit including an inductance component generated at the path of an ESD current flowing through the second ESD protection circuit and a capacitance component of the second ESD protection circuit are able to be very high. In a carrier frequency band of a circuit or line connected to this ESD protection circuit, the occurrence of unnecessary resonance at the ESD protection circuit is effectively reduced or prevented.

Since one end of the first ESD protection circuit and one end of the second ESD protection circuit are commonly connected to the ground, an inductance component generated at a path between the first node and the second node is fixed without being affected by an external circuit connected to this ESD protection circuit. The above-described effect of the reduction in an inductance component is therefore not affected by an external circuit.

In a preferred embodiment of the present invention, the first coil and the third coil are preferably provided in a first region where coil openings of the first coil and the third coil at least partially overlap in plan view, the second coil and the fourth coil are preferably provided in a second region where coil openings of the second coil and the fourth coil at least partially overlap in plan view, and the first ESD protection circuit and the second ESD protection circuit are preferably provided between the first region and the second region. In a limited thickness, the first and second ESD protection circuits and the first, second, third, and fourth coils are able to be disposed. In addition, the unnecessary coupling between each of the first, second, third, and fourth coils and the first and second ESD protection circuits is able to be easily prevented.

In a preferred embodiment of the present invention, a third Zener diode reversely connected to the first Zener diode and the second Zener diode is preferably further included, the first ESD protection circuit is preferably a series circuit including the first Zener diode and the third Zener diode, and the second ESD protection circuit is preferably a series circuit including the second Zener diode and the third Zener diode. With this configuration, ESD protection is able to be performed irrespective of the polarity of a surge voltage applied between a balanced port and the ground.

In a preferred embodiment of the present invention, a mutual inductance generated by coupling between the first coil and the third coil preferably has a value by which an inductance component generated at a path of an ESD current flowing through the first ESD protection circuit is canceled and a mutual inductance generated by coupling between the second coil and the fourth coil preferably has a value by which an inductance component generated at a path of an ESD current flowing through the second ESD protection circuit is canceled. With this configuration, an inductance component generated at a path of an ESD current flowing through the first ESD protection circuit and an inductance component generated at a path of an ESD current flowing through the second ESD protection circuit are canceled. The resonant frequencies of the above-described resonant circuits are therefore able to be very high.

A differential transmission line according to a preferred embodiment of the present invention includes a differential transmission line that includes a first line and a second line and transmits a differential signal and an ESD protection circuit connected to the differential transmission line.

The ESD protection circuit includes a first terminal and a second terminal defining a first balanced port connected to the differential transmission line, a third terminal and a fourth terminal defining a second balanced port connected to the differential transmission line, a first ESD protection circuit that includes a first Zener diode and is connected between a ground and a first node between the first terminal and the third terminal, a second ESD protection circuit that includes a second Zener diode, is connected between the ground and a second node between the second terminal and the fourth terminal, and is symmetric or substantially symmetric with respect to the first ESD protection circuit, a first coil provided in series between the first terminal and the first node, a third coil that is cumulatively connected to the first coil and is provided in series between the third terminal and the first node, a second coil provided in series between the second terminal and the second node, and a fourth coil that is cumulatively connected to the second coil and is provided in series between the fourth terminal and the second node.

With this configuration, the resonant frequency of a resonant circuit including the capacitance component of the first ESD protection circuit and an inductance component generated at the path of an ESD current flowing through the first ESD protection circuit and the resonant frequency of a resonant circuit including the capacitance component of the second ESD protection circuit and an inductance component generated at the path of an ESD current flowing through the second ESD protection circuit are able to be changed to frequencies in a frequency band higher than the carrier frequency band. The characteristics of the differential transmission line are therefore able to be maintained in a higher frequency band.

A common mode filter circuit according to a preferred embodiment of the present invention includes a common mode choke coil, an ESD protection circuit connected to the common mode choke coil, a first terminal and a second terminal defining a first balanced port, a third terminal and a fourth terminal defining a second balanced port, and a fifth terminal and a sixth terminal defining a third balanced port. The ESD protection circuit includes a first ESD protection circuit that includes a first Zener diode and is connected between a ground and a first node between the first terminal and the third terminal, a second ESD protection circuit that includes a second Zener diode, is connected between the ground and a second node between the second terminal and the fourth terminal, and is symmetric or substantially symmetric with respect to the first ESD protection circuit, a first coil provided in series between the first terminal and the first node, a third coil that is cumulatively connected to the first coil and is provided in series between the third terminal and the first node, a second coil provided in series between the second terminal and the second node, and a fourth coil that is cumulatively connected to the second coil and is provided in series between the fourth terminal and the second node.

The common mode choke coil includes a fifth coil connected between the third terminal and the fifth terminal and a sixth coil that is connected between the fourth terminal and the sixth terminal and is coupled to the fifth coil.

With this configuration, the resonant frequency of a resonant circuit including the capacitance component of the first ESD protection circuit and an inductance component generated at the path of an ESD current flowing through the first ESD protection circuit and the resonant frequency of a resonant circuit including the capacitance component of the second ESD protection circuit and an inductance component generated at the path of an ESD current flowing through the second ESD protection circuit are able to be changed to frequencies in a frequency band higher than the carrier frequency band. The characteristics of the common mode filter circuit are therefore able to be maintained in a higher frequency band.

An ESD protection device according to another preferred embodiment of the present invention includes a multilayer body in which a plurality of insulating resin layers are laminated, a plurality of terminal electrodes provided on a mounting surface of the multilayer body, an ESD protection semiconductor chip component embedded in the multilayer body to define a diode, and a matching circuit that is provided in the multilayer body and is connected between the ESD protection semiconductor chip component and the plurality of terminal electrodes.

The matching circuit includes loop conductor patterns provided in or on the insulating resin layers.

The loop conductor patterns are provided in or on layers between a layer in which the ESD protection semiconductor chip component is embedded and the mounting surface of the multilayer body.

With this configuration, a route from a mounting terminal electrode to the ESD protection semiconductor chip component via the matching circuits becomes the shortest and an unnecessary parasitic component (an inductance component in particular) is not substantially generated. A peak voltage is therefore able to be reduced at the time of ESD protection. That is, the ESD protection performance of an ESD circuit is able to be maintained.

A composite device according to another preferred embodiment of the present invention includes a multilayer body in which a plurality of insulating resin layers are laminated, a plurality of terminal electrodes provided on a mounting surface of the multilayer body, an ESD protection semiconductor chip component embedded in the multilayer body to define a diode, a matching circuit that is provided in the multilayer body and is connected between the ESD protection semiconductor chip component and the plurality of terminal electrodes, and a common mode filter circuit that is connected between the matching circuit and the plurality of terminal electrodes and is provided in the multilayer body. The matching circuit includes first loop conductor patterns provided in or on the insulating resin layers.

The common mode filter circuit includes second loop conductor patterns provided in or on the insulating resin layers.

The first loop conductor patterns are provided in or on layers between a layer in which the ESD protection semiconductor chip component is embedded and the mounting surface of the multilayer body.

The second loop conductor patterns are provided in or on layers between the layer in which the ESD protection semiconductor chip component is embedded and a surface opposite to the mounting surface of the multilayer body.

With this configuration, an unnecessary parasitic component is not substantially generated between a mounting terminal electrode and the matching circuit. In addition, since the ESD protection circuit is disposed nearer to the mounting terminal electrode than the common mode filter circuit, an unnecessary parasitic component is not substantially generated between the mounting terminal electrode and the ESD protection circuit. A peak voltage is therefore able to be reduced at the time of ESD protection, and the ESD protection performance of an ESD circuit is able to be maintained.

Preferred embodiments of the present invention provide ESD protection circuits in which resonance between an inductance component generated at a path of an ESD current flowing through the ESD protection circuit and a parasitic capacitance generated at the ESD protection circuit is reduced or prevented, differential transmission lines and common mode filter circuits which include the ESD protection circuits, ESD protection devices, and composite devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
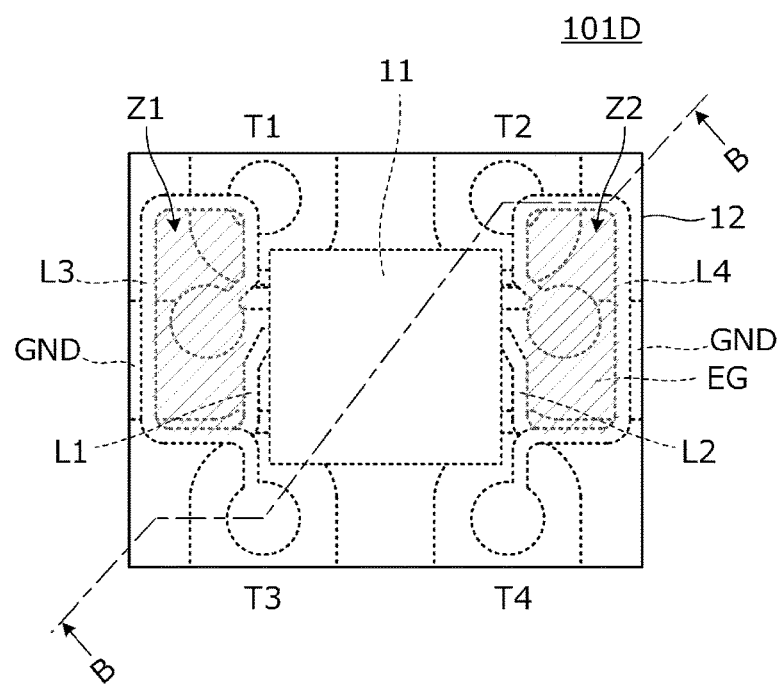
FIG. 1A is a plan view illustrating the internal configuration of an ESD protection device 101D according to a first preferred embodiment of the present invention.

A plurality of preferred embodiments of the present invention will be described below by providing concrete examples with reference to the drawings. The same portions are denoted by the same reference symbols in the drawings. While the preferred embodiments are described separately for the sake of convenience in consideration of ease of explanation and understanding of key points, configurations described in the different preferred embodiments may be partially replaced or combined. In the second and subsequent preferred embodiments, descriptions of matters common to those in the first preferred embodiment will be omitted and only different points will be described. In particular, descriptions of similar advantageous effects obtained with similar configurations will not be repeated in each of the preferred embodiments.

First Preferred Embodiment

Figure 1B:
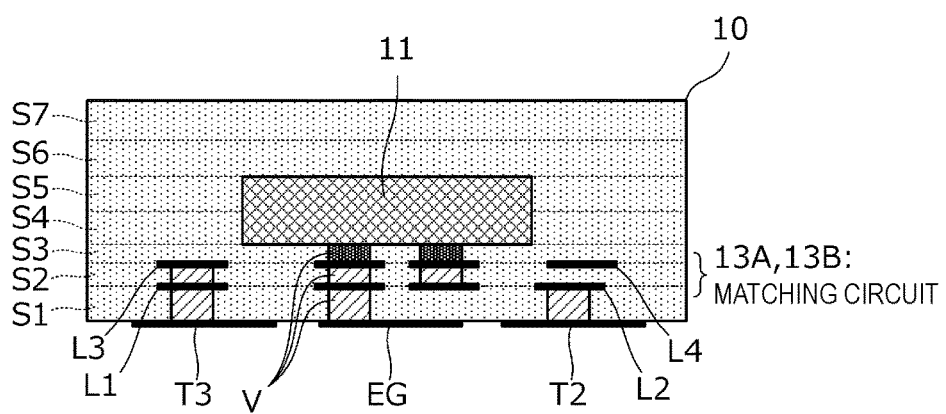
FIG. 1B is a cross-sectional diagram taken along a line B-B in FIG. 1A.
Figure 2:
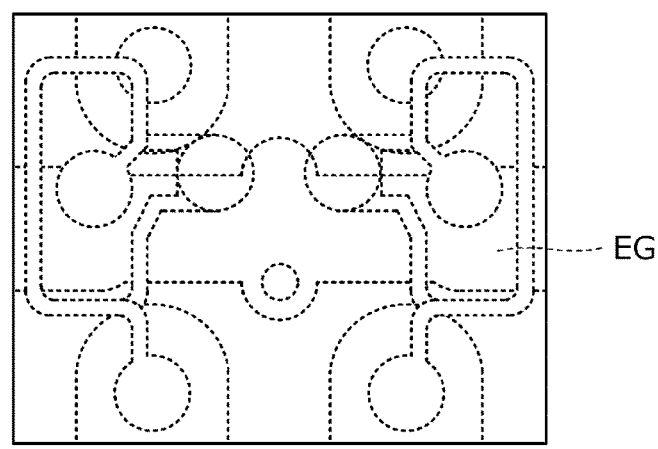
FIG. 2 is a plan view of the ESD protection device 101D excluding a diode chip 11.
Figure 3:
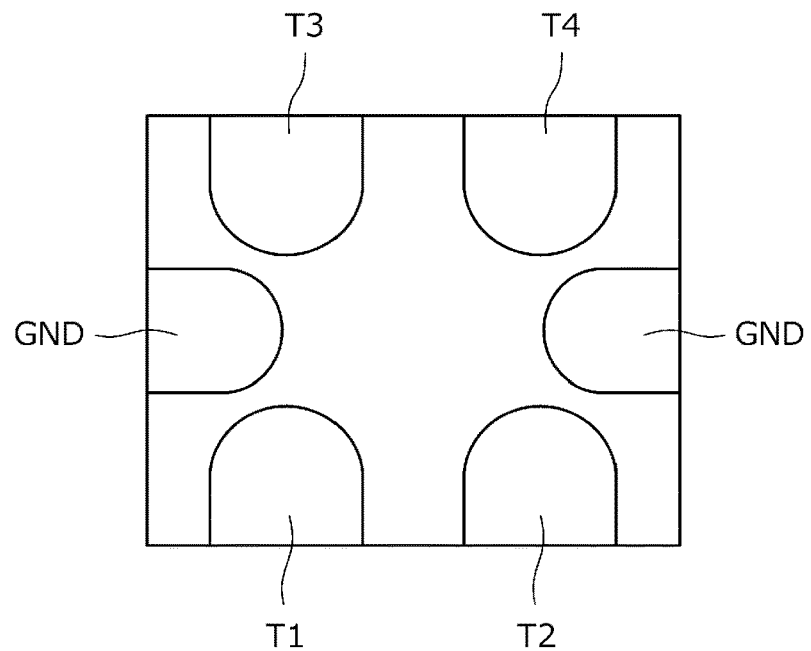
FIG. 3 is a bottom view of the ESD protection device 101D.

FIG. 1A is a plan view illustrating the internal configuration of an ESD protection device 101D according to the first preferred embodiment of the present invention. FIG. 1B is a cross-sectional diagram taken along a line B-B in FIG. 1A. FIG. 2 is a plan view of the ESD protection device 101D excluding a diode chip 11 to be described below. FIG. 3 is a bottom view of the ESD protection device 101D.

The ESD protection device 101D includes a multilayer body (resin multilayer board) including resin sheets on which predetermined conductor patterns are provided. A diode chip 11 is embedded in a multilayer body 10. The diode chip 11 is an example of an "ESD protection semiconductor chip defining a diode".

The element assembly of the ESD protection device 101D includes a multilayer body (resin multilayer board) including a plurality of insulating resin layers. Insulating resin layers S1 to S7 are thermoplastic resin sheets typically made of polyimide or liquid crystal polymer, for example. The multilayer body is obtained by connecting the surfaces of the thermoplastic resin layers (sheets) S1 to S7 by fusion splicing, for example. The thermoplastic resin sheets are simultaneously laminated, heated, and pressurized to be united. Between the thermoplastic resin sheets, an adhesive layer may be provided.

The diode chip 11 includes a first Zener diode, a second Zener diode, and a third Zener diode. These Zener diodes define a first ESD protection circuit and a second ESD protection circuit. The structure of the diode chip 11 will be described in detail below.

The ESD protection device 101D includes a first terminal T1, a second terminal T2, a third terminal T3, a fourth terminal T4, and a ground terminal GND. The first terminal T1 and the second terminal T2 define a first balanced port. The third terminal T3 and the fourth terminal T4 define a second balanced port. The ground terminal GND is brought into conduction with a ground electrode.

Figure 4:
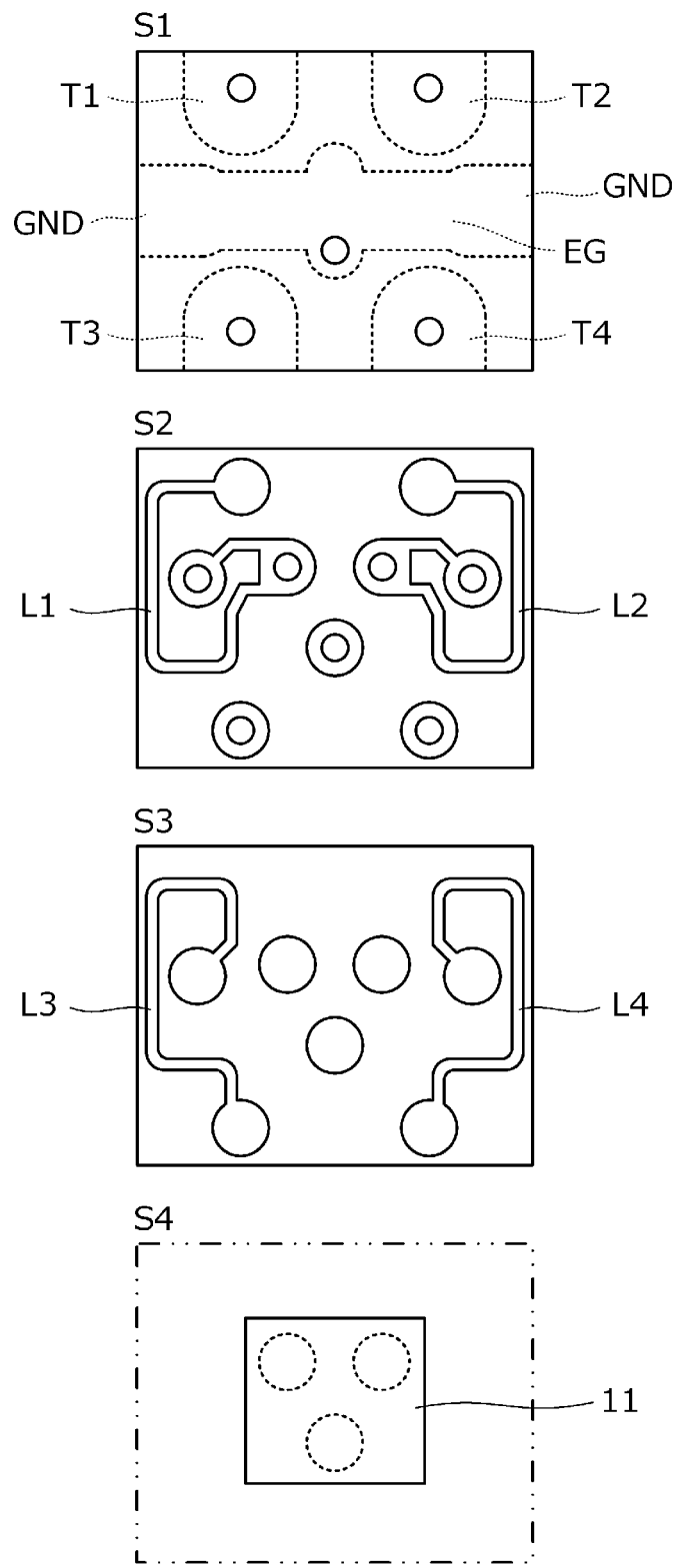
FIG. 4 is a diagram illustrating a portion of a conductor pattern provided in or on each layer of a multilayer body 10.

FIG. 4 is a diagram illustrating a portion of a conductor pattern provided in each layer of the multilayer body 10. Referring to FIG. 4, on the undersurface of the layer S1, the first terminal T1, the second terminal T2, the third terminal T3, the fourth terminal T4, the ground terminal GND, and a ground electrode EG are provided. A resist film is provided on the undersurface of the multilayer body 10. Exposed portions of the undersurface of the multilayer body 10 are used as mounting terminals illustrated in FIG. 3. In the layer S2, a loop conductor pattern defining the third coil L3 and a loop conductor pattern defining a fourth coil L4 are provided. In the layer S3, a loop conductor pattern defining the first coil L1 and a loop conductor pattern defining the second coil L2 are provided. In the layer S4, a position at which the diode chip 11 is disposed (embedded) is illustrated.

Thus, in the multilayer body, loop conductors and routing conductors are provided. A loop conductor pattern (in-plane conductor) defining a loop conductor is obtained by patterning a metal foil, such as a copper foil, for example, on the surface of a thermoplastic resin sheet by photolithography and etching. An interlayer connection conductor (via-hole conductor) V is obtained by filling a metallic material containing tin or other suitable metallic material, for example, into a hole for a via-hole conductor provided in a thermoplastic resin sheet.

Copper plating is applied to the surfaces of the first terminal T1, the second terminal T2, the third terminal T3, and the fourth terminal T4 of the diode chip 11 and the surface of the ground terminal GND.

When each thermoplastic resin sheet is heated and pressurized, the metallic material filled into the hole for a via-hole conductor is metalized and is bonded to the first terminal T1, the second terminal T2, the third terminal T3, the fourth terminal T4, and the ground terminal GND (by, for example, Transient Liquid Phase Diffusion Bonding).

The first terminal T1, the second terminal T2, the third terminal T3, the fourth terminal T4, and the ground terminal GND, which are provided on the undersurface of the multilayer body, are also obtained by patterning a metal foil, such as a copper foil, for example, on the surface of a thermoplastic resin sheet by photolithography and etching. A plating film, such as a Ni/Au or Ni/Sn plating film, for example, is preferably provided on the surfaces of these terminals.

Referring to FIG. 1A, the first coil L1 and the third coil L3 are coil patterns having winding axes (center axes) along a lamination direction in which the insulating resin layers S1 to S7 are laminated. In a first region Z1, the coil openings of the first coil L1 and the third coil L3 at least partially overlap in plan view. The second coil L2 and the fourth coil L4 are coil patterns having winding axes (center axes) along the lamination direction in which the insulating resin layers S1 to S7 are laminated. In a second region Z2, the coil openings of the second coil L2 and the fourth coil L4 at least partially overlap in plan view. Thus, between the first region Z1 and the second region Z2, the diode chip 11 defining the first ESD protection circuit and the second ESD protection circuit is disposed. That is, the diode chip 11 is disposed so as not to entirely cover the opening (the area of the inner diameter) of coil patterns defining the first coil L1, the second coil L2, the third coil L3, and the fourth coil L4 in plan view from the lamination direction. With this structure, the reduction in the Q values of the first coil L1, the second coil L2, the third coil L3, and the fourth coil L4 is effectively reduced or prevented. In a limited thickness, the first and second ESD protection circuits and the first, second, third, and fourth coils are able to be disposed. In addition, the unnecessary coupling between each of the first, second, third, and fourth coils and the first and second ESD protection circuits is able to be prevented.

As described above, the ESD protection device 101D according to this preferred embodiment is a single component in a single package. That is, the ESD protection device 101D is disposed on, for example, a circuit board.

Figure 5:
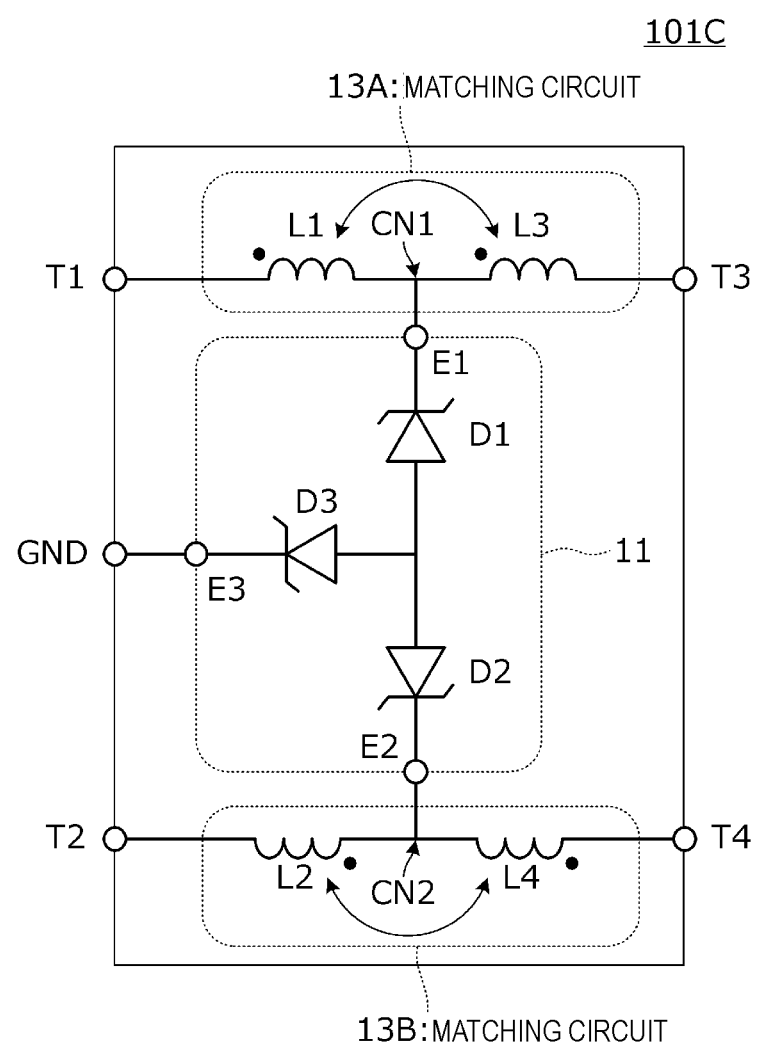
FIG. 5 is a circuit diagram of an ESD protection circuit 101C according to the first preferred embodiment of the present invention and the ESD protection device 101D.

FIG. 5 is a circuit diagram of an ESD protection circuit 101C according to the present preferred embodiment. This circuit diagram is also the circuit diagram of the ESD protection device 101D. The first coil L1 and the third coil L3 are connected in series, and a node between them is a first node CN1. The node CN1 corresponds to a "first node between a first terminal (T1) and a third terminal (T3)" according to the present invention. The second coil L2 and the fourth coil L4 are connected in series, and a node between them is a second node CN2. This node CN2 corresponds to a "second node between a second terminal (T2) and a fourth terminal (T4)".

The first coil L1 and the third coil L3 are cumulatively connected. The second coil L2 and the fourth coil L4 are cumulatively connected. The first coil L1 and the third coil L3 define a matching circuit 13A. The second coil L2 and the fourth coil L4 define a matching circuit 13B.

The diode chip 11 includes a first electrode E1, a second electrode E2, and a third electrode E3 on the outer surface thereof and, includes a first Zener diode D1, a second Zener diode D2, and a third Zener diode D3 therein. The first Zener diode D1 and the second Zener diode D2 are reversely connected in series to each other between the first electrode E1 and the second electrode E2. The third Zener diode D3 is connected between the third electrode E3 and a node between the first Zener diode D1 and the second Zener diode D2.

The first Zener diode D1 is connected between the first node CN1 and a ground electrode via the third Zener diode D3. The second Zener diode D2 is connected between the second node CN2 and the ground electrode via the third Zener diode D3. A series circuit including the first Zener diode D1 and the third Zener diode D3 defines the first ESD protection circuit. A series circuit including the second Zener diode D2 and the third Zener diode D3 defines the second ESD protection circuit. The second ESD protection circuit is symmetric or substantially symmetric with respect to the first ESD protection circuit.

Figure 6A:
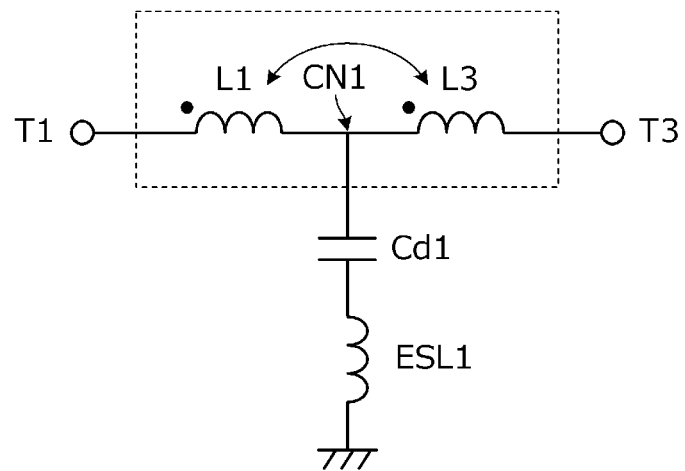
FIGS. 6A and 6B are diagrams illustrating a relationship between a mutual inductance generated by the coupling between a first coil L1 and a third coil L3 and an inductance component generated at an ESD current path.
Figure 6B:
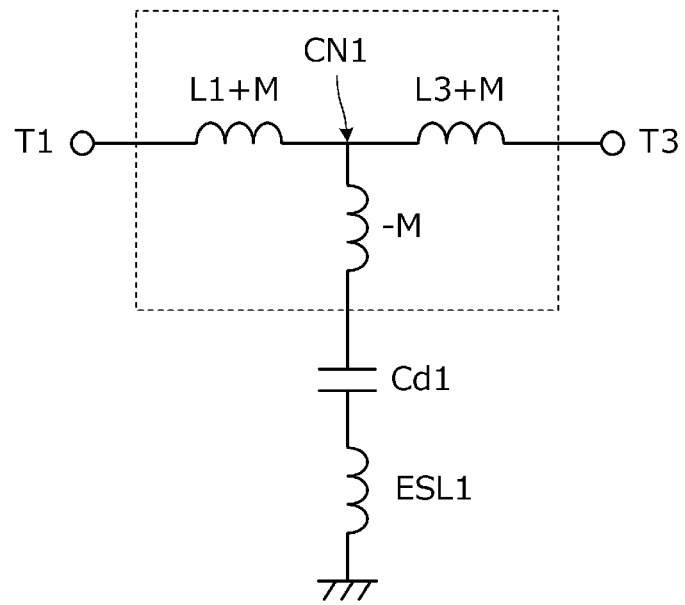

FIGS. 6A and 6B are diagrams illustrating a relationship between a mutual inductance generated by the coupling between the first coil L1 and the third coil L3 and an inductance component generated at an ESD current path. In FIG. 6A, a capacitor Cd1 is a parasitic capacitance generated at the depletion layer of the first Zener diode D1 (the first Zener diode D1 (see FIG. 5) is connected between the first node CN1 and a virtual ground). An inductor ESL1 is an inductance component generated at an ESD current path (a path between the first node CN1 and the ground, that is, the first Zener diode and a portion of a conductor pattern to which the first Zener diode is connected). A transformer generated by the coupling between the first coil L1 and the third coil L3 illustrated in FIG. 6A is represented by a T-type equivalent circuit illustrated in FIG. 6B. A mutual inductance—M generated by the coupling between the first coil L1 and the third coil L3 is equivalently connected in series between the first node CN1 and the ground. The relationship of $M=k*\sqrt{(L1*L2)}$ is satisfied where k represents the coupling coefficient of the coupling between the first coil L1 and the third coil L3.

Since the first coil L1 and the third coil L3 are cumulatively connected, the above-described mutual inductance is a negative inductance. An inductance component generated at an ESD current path in the above-described ESD protection device is therefore canceled. In a case where the mutual inductance M is equal or substantially equal to the inductance of the inductor ESL1, the inductance component of the ESD current path becomes 0. The relationship between a mutual inductance generated by the coupling between the second coil L2 and the fourth coil L4 and an inductance component generated at the ESD current path is also the same or substantially the same as the above-described relationship.

As described above, the matching circuits 13A and 13B illustrated in FIG. 5 define an ESL cancellation circuit that cancels inductance components generated at the ESD current path. The matching circuits 13A and 13B are provided at layers between a layer in which the diode chip 11 is embedded and the mounting surface of the multilayer body 10 as illustrated in FIG. 1B. With this configuration, a route from a mounting terminal electrode to the diode chip 11 via the matching circuits 13A and 13B becomes the shortest and an unnecessary parasitic component (an inductance component in particular) is not substantially generated. A peak voltage is able to be reduced at the time of ESD protection. That is, the ESD protection performance of an ESD circuit is able to be maintained.

Figure 7:
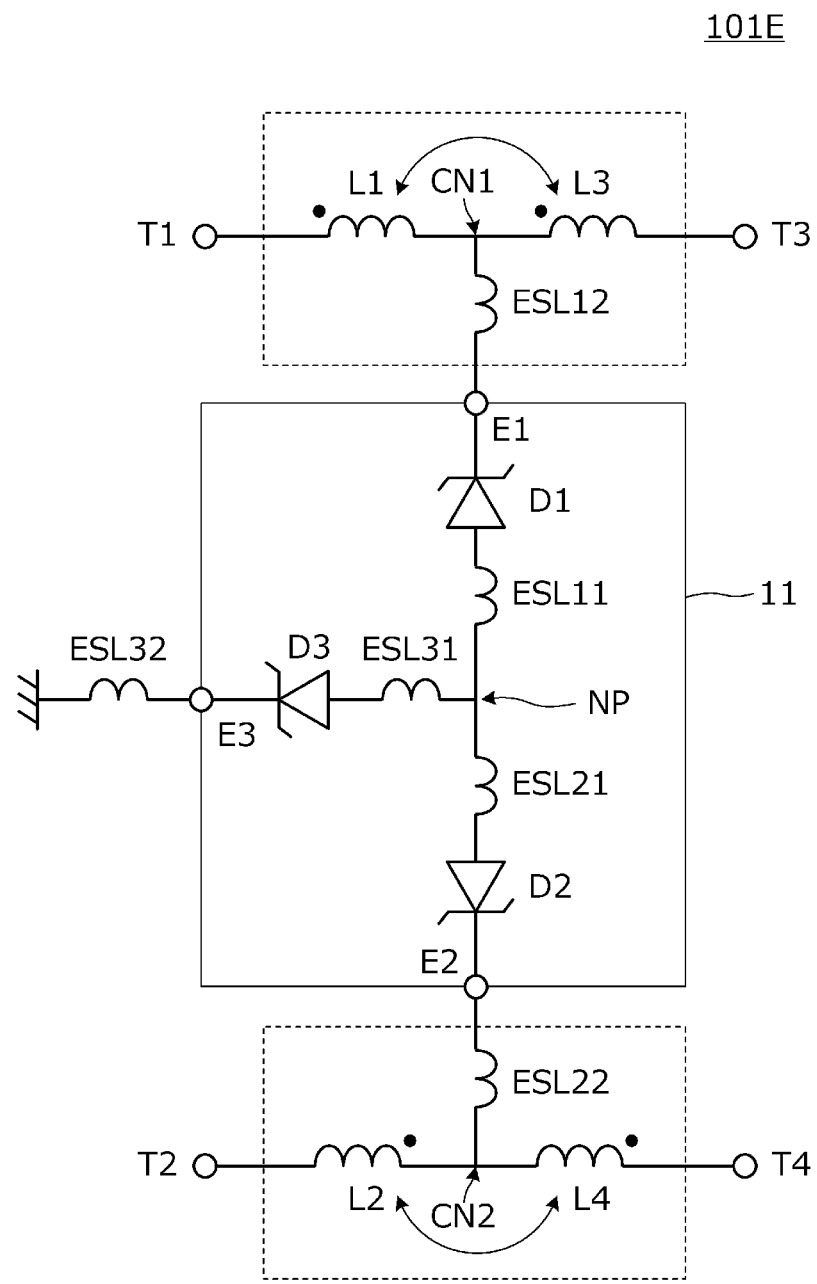
FIG. 7 is a circuit diagram of an ESD protection circuit 101E according to the first preferred embodiment of the present invention and an equivalent circuit diagram of the ESD protection device 101D in which the inductance component of an ESD current path is also illustrated.

FIG. 7 is a circuit diagram of an ESD protection circuit 101E according to this preferred embodiment and an equivalent circuit diagram of the ESD protection device 101D in which the inductance component of an ESD current path is also illustrated. The diode chip 11 includes the inductance component ESL11 connected in series to the first Zener diode D1, an inductance component ESL21 connected in series to the second Zener diode D2, and an inductance component ESL31 connected in series to the third Zener diode D3. The inductance component ESL12 is located between the first node CN1 and the first electrode E1. An inductance component ESL22 is located between the second node CN2 and the second electrode E2. An inductance component ESL32 is located between the ground and the third electrode E3.

As illustrated in FIG. 6B, a negative inductance generated by the coupling between the first coil L1 and the third coil L3 reduces inductance components (ESL11 and ESL12) and a negative inductance generated by the coupling between the second coil L2 and the fourth coil L4 reduces inductance components (ESL21 and ESL22). That is, the coupling coefficient of the coupling between the first coil L1 and the third coil L3 may be determined such that the coupling between the first coil L1 and the third coil L3 generates a negative inductance used to reduce (preferably cancel) an inductance component (ESL11+ESL12). The coupling coefficient of the coupling between the second coil L2 and the fourth coil L4 may be similarly determined such that the coupling between the second coil L2 and the fourth coil L4 generates a negative inductance used to reduce (preferably cancel) an inductance component (ESL21+ESL22).

The inductance component ESL31 connected in series to the third Zener diode D3 and the inductance component ESL32 generated between the third electrode E3 of the diode chip 11 and the ground which are illustrated in FIG. 7 remain, but these inductance components are not equivalently present as will be described below. That is, as long as the ESD protection device 101D performs a balanced operation, the node between the first Zener diode D1 and the second Zener diode D2 is a neutral point (a point NP illustrated in FIG. 7) from the viewpoint of an electric potential. Since the neutral point NP and the ground have the same potential, a signal current does not flow through the inductance component ESL31 connected in series to the third Zener diode D3 and the inductance component ESL32 generated between the third electrode E3 of the diode chip 11 and the ground. Accordingly, the ESD protection device 101D is substantially not affected by these inductance components.

In the ESD protection device 101D according to the present preferred embodiment, two Zener diodes that are reversely connected in series to each other are provided between the first node CN1 and the ground and two Zener diodes that are reversely connected in series to each other are provided between the second node CN2 and the ground. The same ESD protection characteristics are therefore exhibited against both a positive surge voltage and a negative surge voltage.

Figure 8:
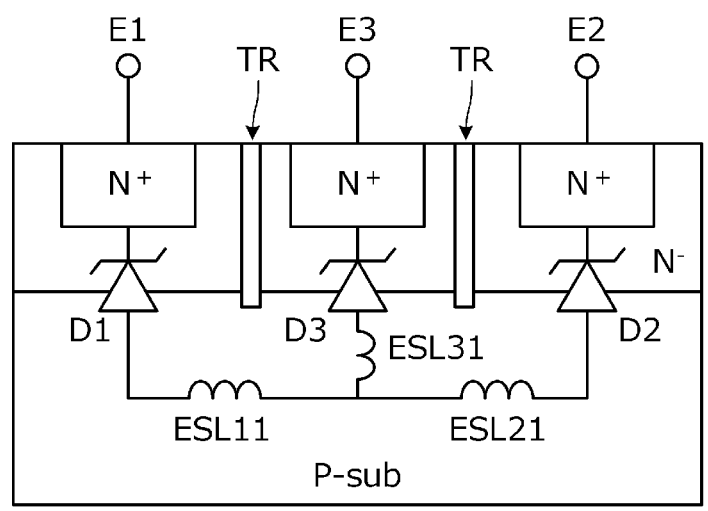
FIG. 8 is a cross-sectional diagram illustrating the configuration of the diode chip 11.

FIG. 8 is a cross-sectional diagram illustrating the configuration of the diode chip 11. In an element, the symbols of the Zener diodes and the symbols of the inductance components are illustrated. In this diode chip, an N⁻ epitaxial layer is provided on the surface of a P-type silicon substrate P-sub, trenches TR for element isolation are provided, and an impurity is implanted into the N⁻ epitaxial layer in appropriate concentrations, so that N⁺ regions are provided.

Although not illustrated in FIG. 8, an insulating film preferably made of, for example, SiO₂ is provided on the surface of a substrate, contact holes are provided at electrode formation positions in the N⁺ regions, and metal electrodes E1, E2, and E3 preferably made of, for example, Al are provided at opening positions of the contact holes.

Figure 9A:
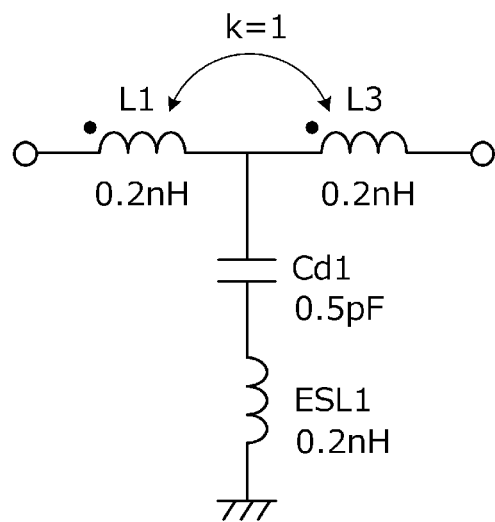
FIG. 9A is a circuit diagram illustrating exemplary values of the inductances of the first coil L1 and the third coil L3, a coupling coefficient k of the coupling between the first coil L1 and the third coil L3, a parasitic capacitance Cd1 at an ESD current path, and an inductance component ESL1 at the ESD current path.
Figure 9B:
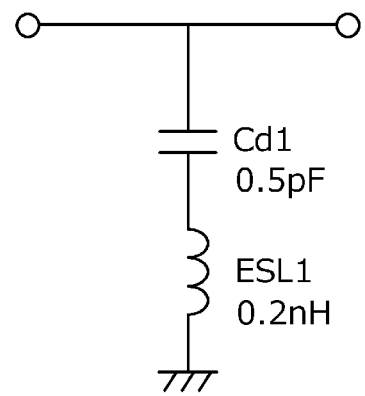
FIG. 9B is circuit diagram of a comparative example that does not include the first coil L1 and a second coil L2.
Figure 9C:
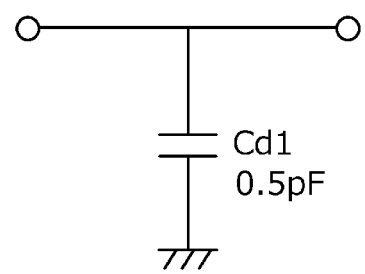
FIG. 9C is a circuit diagram of a comparative example in which there is no inductance component.

Next, the effect of an improvement in transmission characteristics resulting from the cancellation of an inductance component at the ESD current path by a mutual inductance generated by the coupling between the first coil L1 and the third coil L3 will be described. FIG. 9A is a circuit diagram illustrating exemplary values of the inductances of the first coil L1 and the third coil L3, the coupling coefficient k of the coupling between the first coil L1 and the third coil L3, a parasitic capacitance Cd1 at the ESD current path, and the inductance component ESL1 at the ESD current path. FIG. 9B is circuit diagram of a comparative example that does not include the first coil L1 and the second coil L2. FIG. 9C is a circuit diagram of a comparative example in which there is no inductance component.

Figure 10:
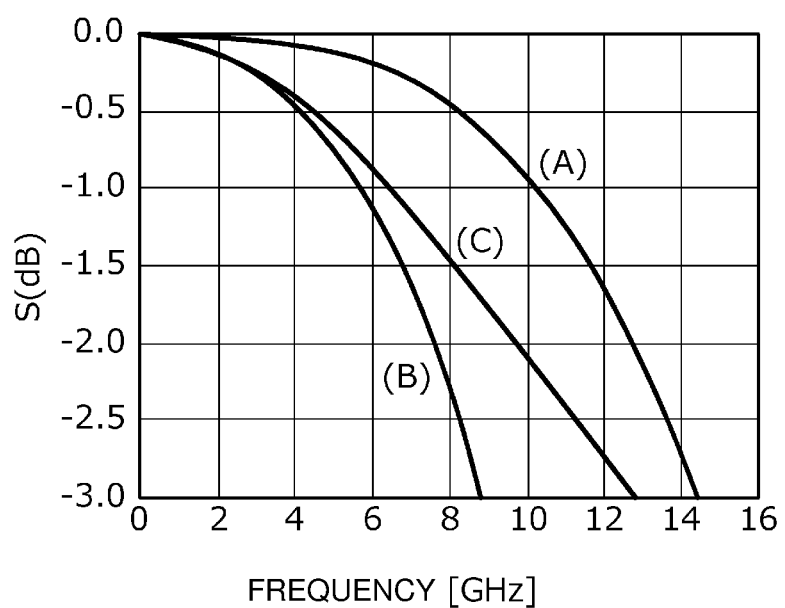
FIG. 10 is a diagram illustrating the bandpass characteristics of three differential transmission lines illustrated in FIGS. 9A-9C.

FIG. 10 is a diagram illustrating the bandpass characteristics of three differential transmission lines illustrated in FIGS. 9A-9C. In a differential transmission line illustrated in FIG. 9B which does not include the first coil L1 and the third coil L3, an LC resonant circuit including the parasitic capacitance Cd1 and the inductance component ESL1 operates as a trap filter and transmission characteristics are attenuated to about −3 dB at about 9 GHz. In contrast, in a transmission line according to this preferred embodiment illustrated in FIG. 9A, a band is broadened to about 14.5 GHz, for example. The transmission characteristics of a transmission line illustrated in FIG. 9C are inferior to those of a transmission line according to the present preferred embodiment because of impedance mismatching.

Second Preferred Embodiment

An exemplary ESD protection device according to a second preferred embodiment of the present invention that differs from an ESD protection device according to the first preferred embodiment in the configurations of the first ESD protection circuit and the second ESD protection circuit will be described.

Figure 11:
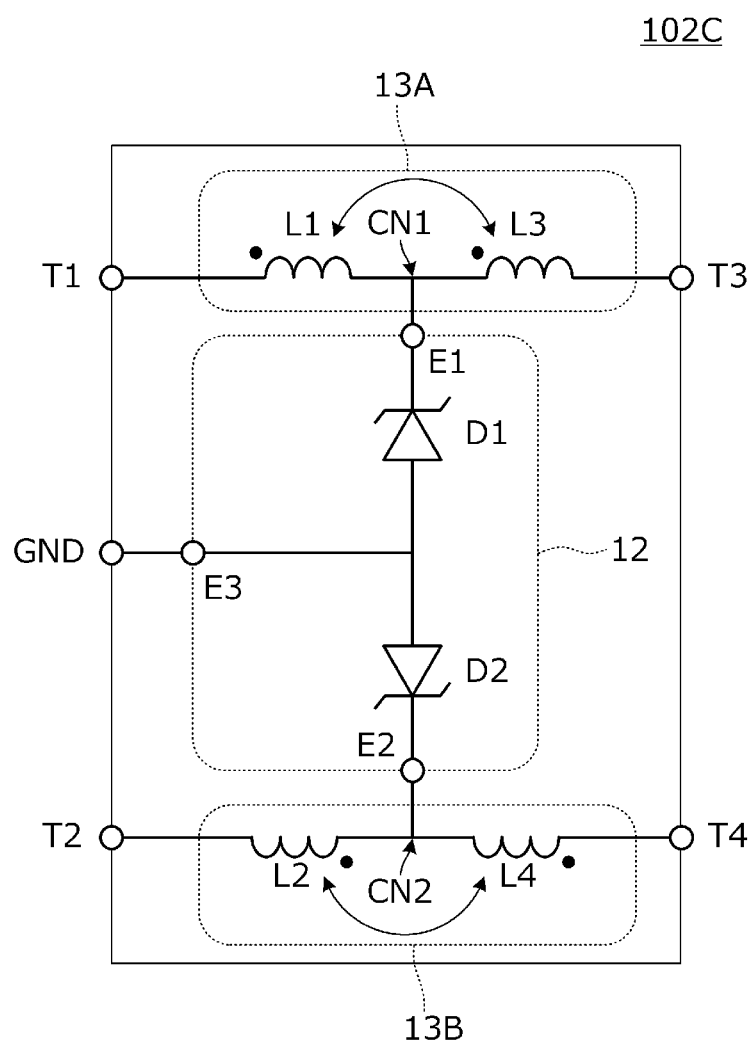
FIG. 11 is a circuit diagram of an ESD protection circuit 102C according to a second preferred embodiment of the present invention.

FIG. 11 is a circuit diagram of an ESD protection circuit 102C according to the second preferred embodiment. The ESD protection circuit 102C differs from the ESD protection circuit 101C according to the first preferred embodiment illustrated in FIG. 5 in that the Zener diode D3 is not included. The other configuration is the same or substantially the same as that of the ESD protection circuit 101C.

A diode chip 12 includes the first electrode E1, the second electrode E2, and the third electrode E3 on the outer surface thereof, and includes the first Zener diode D1 and the second Zener diode D2 therein. The first Zener diode D1 and the second Zener diode D2 are reversely connected in series to each other between the first electrode E1 and the second electrode E2. The node between the first Zener diode D1 and the second Zener diode D2 is connected to the third electrode E3.

In the ESD protection circuit 102C, the first Zener diode D1 defines a first ESD protection circuit and the second Zener diode D2 defines a second ESD protection circuit.

Figure 12:
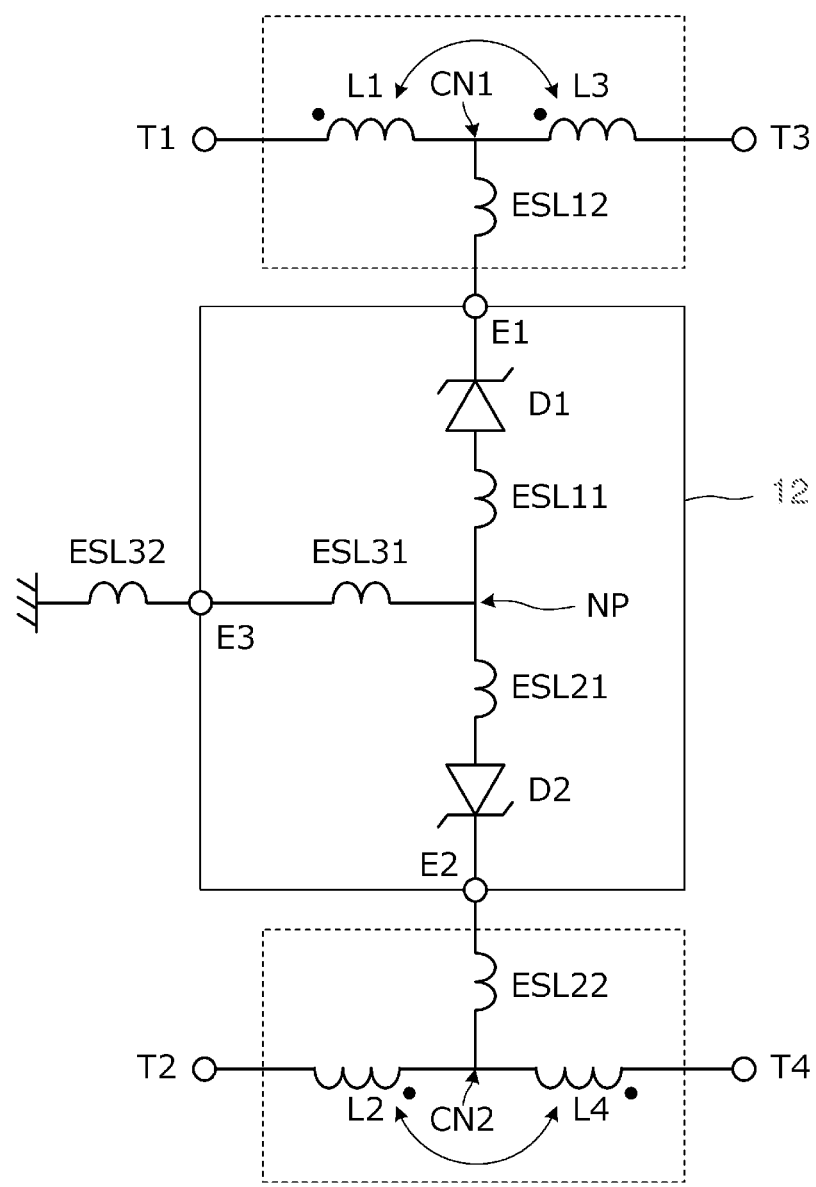
FIG. 12 is a circuit diagram of an ESD protection circuit 102E according to the second preferred embodiment of the present invention in which the inductance component of an ESD current path is also illustrated.

FIG. 12 is a circuit diagram of an ESD protection circuit 102E according to the present preferred embodiment in which the inductance component of an ESD current path is also illustrated. The diode chip 12 includes the inductance component ESL11 connected in series to the first Zener diode D1, the inductance component ESL21 connected in series to the second Zener diode D2, and the inductance component ESL31 between the third electrode E3 and the node between the first Zener diode D1 and the second Zener diode D2. The inductance component ESL12 is located between the first node CN1 and the first electrode E1. The inductance component ESL22 is located between the second node CN2 and the second electrode E2. The inductance component ESL32 is located between the ground and the third electrode E3.

As in the ESD protection circuit 101C according to the first preferred embodiment, a negative inductance generated by the coupling between the first coil L1 and the third coil L3 cancels inductance components (ESL11 and ESL12) and a negative inductance generated by the coupling between the second coil L2 and the fourth coil L4 cancels inductance components (ESL21 and ESL22). Since the neutral point NP and the ground have the same potential, this ESD protection device is substantially not affected by the inductance components ESL31 and ESL32.

Figure 13:
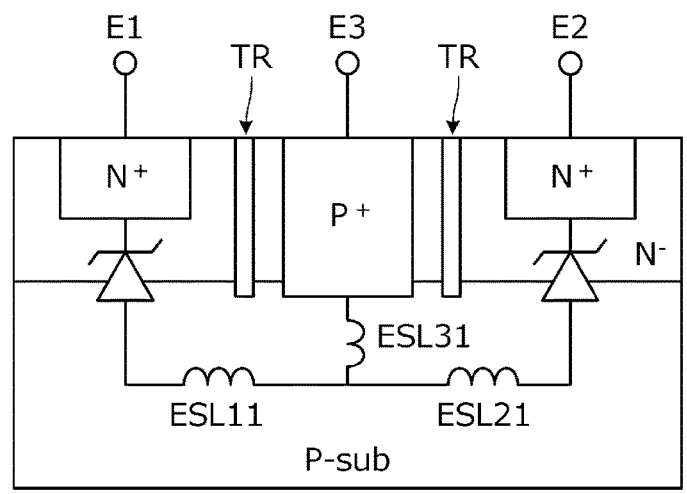
FIG. 13 is a cross-sectional diagram illustrating the configuration of a diode chip 12.

FIG. 13 is a cross-sectional diagram illustrating the configuration of the diode chip 12. In an element, the symbols of Zener diodes and the symbols of inductance components are illustrated. In this diode chip, an N⁻ epitaxial layer is provided on the surface of a P-type silicon substrate P-sub, trenches TR for element isolation are provided, and an impurity is implanted into the N⁻ epitaxial layer in appropriate concentrations, so that N⁺ regions and a P⁺ region are provided. The other configuration of the diode chip 12 is the same or substantially the same as that of the diode chip 11 illustrated in FIG. 8.

Third Preferred Embodiment

In a third preferred embodiment of the present invention, an exemplary differential transmission line including an ESD protection device will be described.

Figure 14:
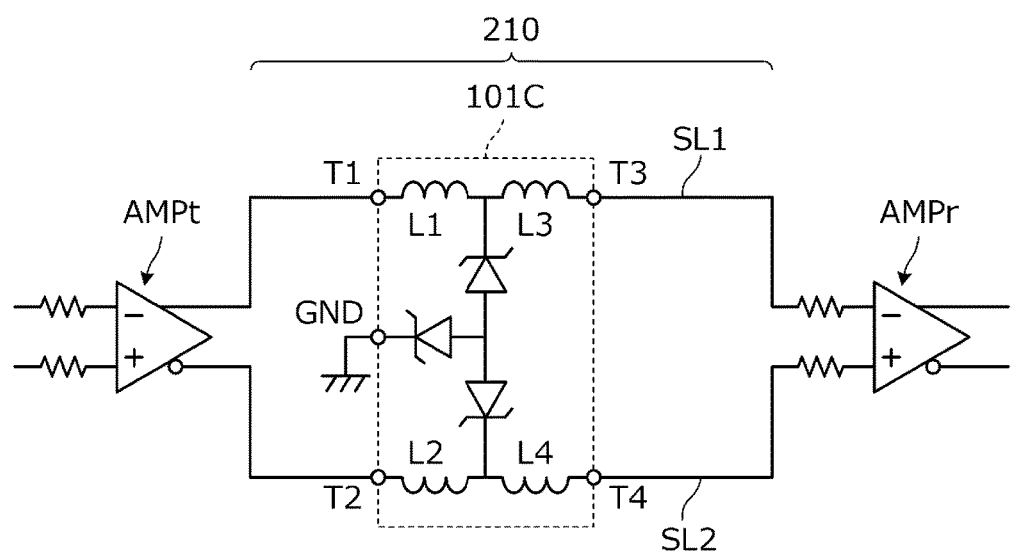
FIG. 14 is a circuit diagram of a differential transmission line 210 according to a third preferred embodiment of the present invention between a transmission-side amplification circuit AMPt and a reception-side amplification circuit AMPr.

FIG. 14 is a circuit diagram of a differential transmission line 210 between a transmission-side amplification circuit AMPt and a reception-side amplification circuit AMPr. The differential transmission line 210 includes a first line SL1 and a second line SL2 and transmits a differential signal. The ESD protection circuit 101C is provided between the first line SL1 and the second line SL2. That is, in this example, the first coil L1 and the third coil L3, which are included in the ESD protection circuit 101C, are connected in series to the first line SL1, and the second coil L2 and the fourth coil L4, which are included in the ESD protection circuit 101C, are connected in series to the second line SL2.

The configuration of the ESD protection circuit 101C is preferably as described in the first preferred embodiment.

Since the resonant frequency of an LC resonant circuit including a parasitic capacitance and an inductance component in an ESD protection device defining the ESD protection circuit 101C is higher than that in an ESD protection device in the related art, the band of a signal frequency that is able to be processed by the differential transmission line 210 is able to be broadened.

Fourth Preferred Embodiment

An exemplary composite device according to a fourth preferred embodiment of the present invention including an ESD protection device and a common mode choke coil will be described.

Figure 15:
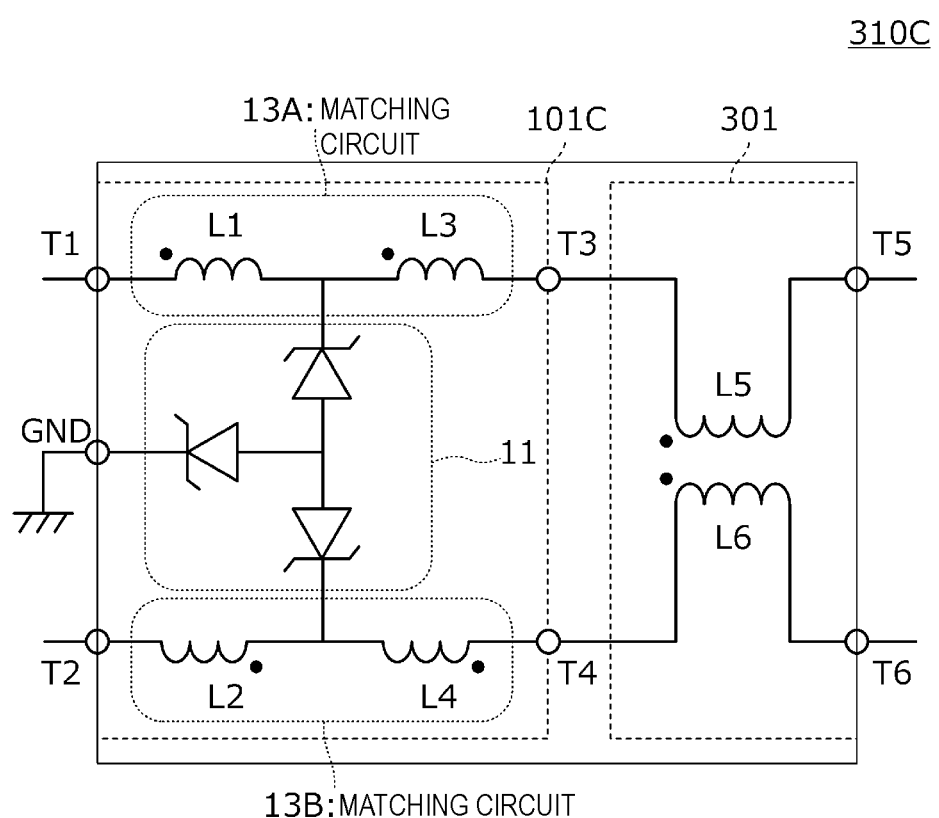
FIG. 15 is a circuit diagram of a composite device circuit 310C according to a fourth preferred embodiment of the present invention.

FIG. 15 is a circuit diagram of a composite device circuit 310C. The first terminal T1 and the second terminal T2 of this common-mode filter define a first balanced port. A fifth terminal T5 and a sixth terminal T6 of this common-mode filter define a third balanced port. A differential circuit or a differential transmission line is connected to the first balanced port and the third balanced port.

The composite device circuit 310C includes a common mode choke coil 301 and the ESD protection circuit 101C connected to the common mode choke coil 301. The common mode choke coil 301 includes a fifth coil L5 and a sixth coil L6 coupled to the fifth coil L5. The configuration of the ESD protection circuit 101C is preferably as described in the first preferred embodiment.

Figure 16:
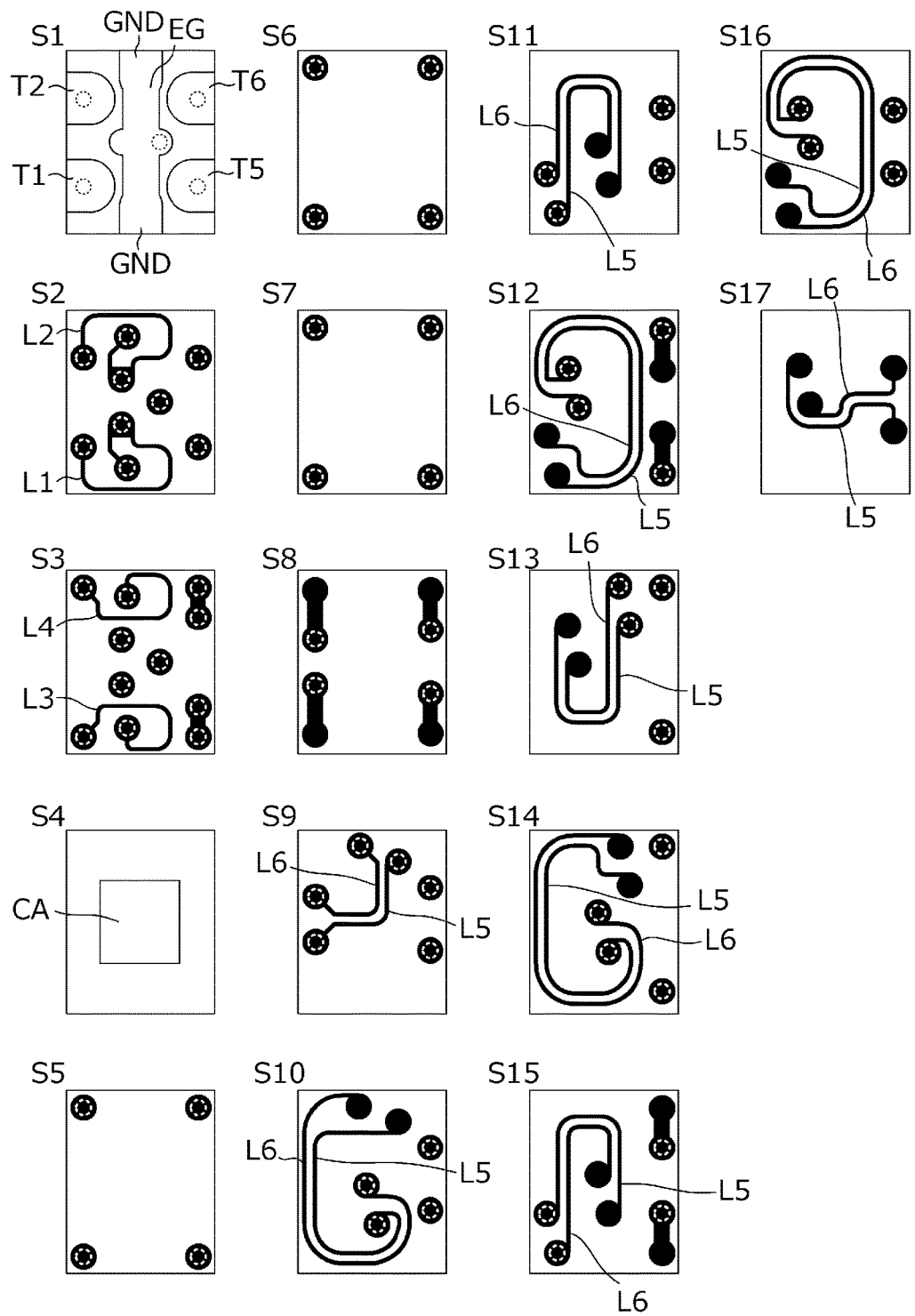
FIG. 16 is a diagram illustrating an exemplary conductor pattern provided in each layer in a composite device according to the fourth preferred embodiment of the present invention.
Figure 17:
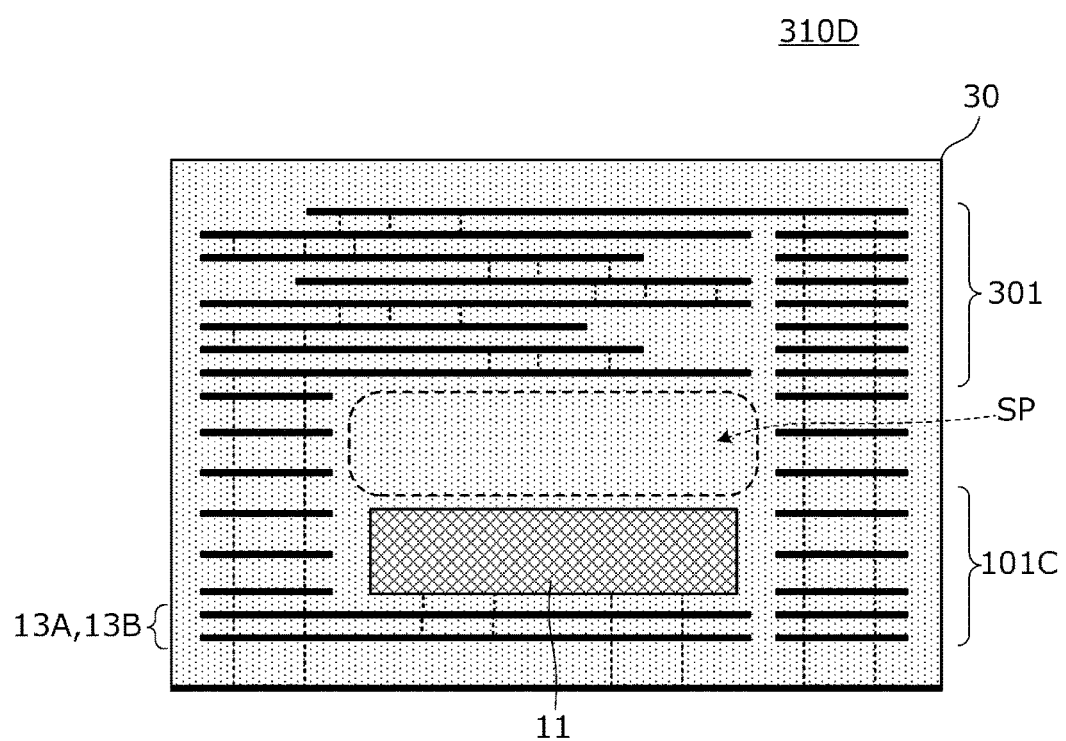
FIG. 17 is a schematic front perspective view of a composite device 310D according to the fourth preferred embodiment of the present invention.

FIG. 16 is a diagram illustrating an exemplary conductor pattern provided in each layer in a common-mode filter according to the present preferred embodiment. FIG. 17 is a schematic front perspective view of a composite device 310D according to the present preferred embodiment. The composite device 310D includes a multilayer body (resin multilayer board) including resin sheets on which respective predetermined conductor patterns are provided. The diode chip 11 is embedded in a multilayer body 30. The configuration of the diode chip 11 is the same or substantially the same as that described in the first preferred embodiment. On the undersurface of the multilayer body 30, a first terminal T1, a second terminal T2, a fifth terminal T5, and a sixth terminal T6 for surface mounting and two ground terminals GND are exposed.

In the multilayer body 30, the ESD protection circuit 101C is provided in lower layers and the common mode choke coil 301 is provided in upper layers. Between the common mode choke coil 301 and the diode chip 11, resin space SP having no conductor pattern is located. The unnecessary coupling between each of the fifth coil L5 and the sixth coil L6 of the common mode choke coil 301 and the conductor of the diode chip 11 therefore does not occur. Since the diode chip 11 is located between the coils L1, L2, L3, and L4 of the ESD protection circuit 101C and the coils L5 and L6 of the common mode choke coil 301, the unnecessary coupling between the coils L1, L2, L3, and L4 of the ESD protection circuit 101C and the coils L5 and L6 of the common mode choke coil 301 therefore does not occur.

FIG. 16 illustrates the undersurfaces of respective layers S1 to S17. On the undersurface of the layer S1, the first terminal T1, the second terminal T2, the fifth terminal T5, the sixth terminal T6, the ground terminals GND, and the ground electrode EG are provided. A resist film is provided on the undersurface of the multilayer body 30, and an exposed portion of the multilayer body 30 on the resist film is used as a surface mounting terminal. The respective conductor patterns of the first coil L1 and the second coil L2 are provided in or on the layer S2. The respective conductor patterns of the third coil L3 and the fourth coil L4 are provided in or on the layer S3. In the layer S4, an opening CA in which the diode chip 11 is to be disposed (embedded) is provided.

Referring to FIG. 16, the fifth coil L5 and the sixth coil L6 are provided in or on the layers S9 to S17. An outer circumferential side and an inner circumferential side that are the respective positions of the fifth coil L5 and the sixth coil L6 are exchanged every layer. As a result, the inductances of the fifth coil L5 and the sixth coil L6 are the same or substantially the same and the balance of a differential line is maintained. The fifth coil L5 and the sixth coil L6 alternately have a large diameter and a small diameter every layer. As a result, a parasitic capacitance generated between the fifth coils L5 in layers, a parasitic capacitance generated between the sixth coils L6 in layers, and a parasitic capacitance between the fifth coil L5 and the sixth coil L6 in layers are reduced.

As described above, at least a portion of the first coil L1, the second coil L2, the third coil L3, and the fourth coil L4 (first loop conductor), which define the matching circuits 13A and 13B, are provided at layers between the layer in which the diode chip 11 is embedded and the mounting surface of the multilayer body 30. At least a portion of the fifth coil L5 and the sixth coil L6 (second loop conductor), which define the common mode choke coil 301, are provided at layers between the layer in which the diode chip 11 is embedded and a surface opposite to the mounting surface of the multilayer body 30. In the present preferred embodiment, the "first loop conductor" corresponds to almost all of the loop conductors defining the first coil L1, the second coil L2, the third coil L3, and the fourth coil L4. The "second loop conductor" corresponds to almost all of the loop conductors defining the fifth coil L5 and the sixth coil L6.

The above-described placement of the coils for the matching circuits 13A and 13B and the common mode choke coil 301 effectively reduce or prevent the coupling between each of the matching circuits 13A and 13B and the common mode choke coil 301 while minimizing or preventing upsizing.

In addition, the decrease in the Q value of the common mode choke coil 301 and the generation of an unnecessary resonance point are reduced or prevented.

Since the semiconductor substrate of the diode chip 11 has a ground potential, a stray capacitance is generated between the common mode choke coil 301 and the ground in a case where the common mode choke coil 301 and the diode chip 11 are close to each other. In the present preferred embodiment, the diode chip 11 is offset on the side of the matching circuits 13A and 13B. That is, electromagnetic space is provided between the diode chip 11 and the common mode choke coil 301. A stray capacitance generated between the common mode choke coil 301 and the ground is therefore reduced.

As described above, the composite device 310D according to the present preferred embodiment is preferably a single component in a single package. That is, the composite device 310D is disposed on, for example, a circuit board.

Figure 18:
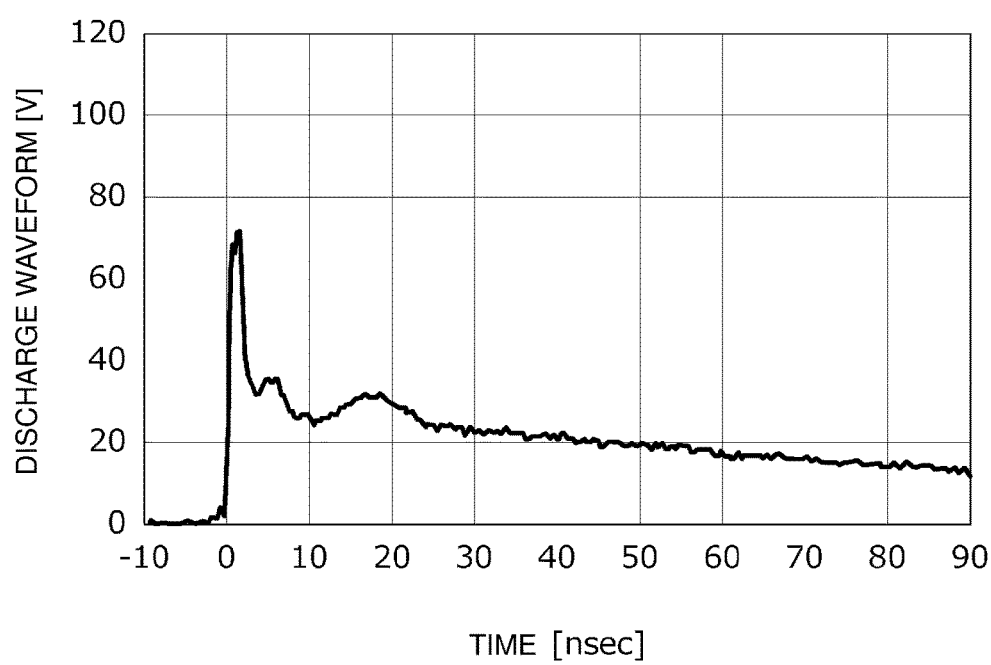
FIG. 18 is a diagram illustrating the ESD protection characteristics of the composite device 310D according to the fourth preferred embodiment of the present invention.

FIG. 18 is a diagram illustrating the ESD protection characteristics of the composite device 310D according to the present preferred embodiment. Specifically, a discharge voltage waveform at the time of application of contact 8 kV was checked with the IEC61000-4-2 test standard. This test standard is used for the assessment of immunity of an electronic apparatus against an electrostatic discharge generated directly from an operator or by a proximal object at a low relative humidity.

As illustrated in FIG. 18, a response time is on the order of about 1 ns, and a discharge voltage is less than about 80 V, for example.

Figure 19:
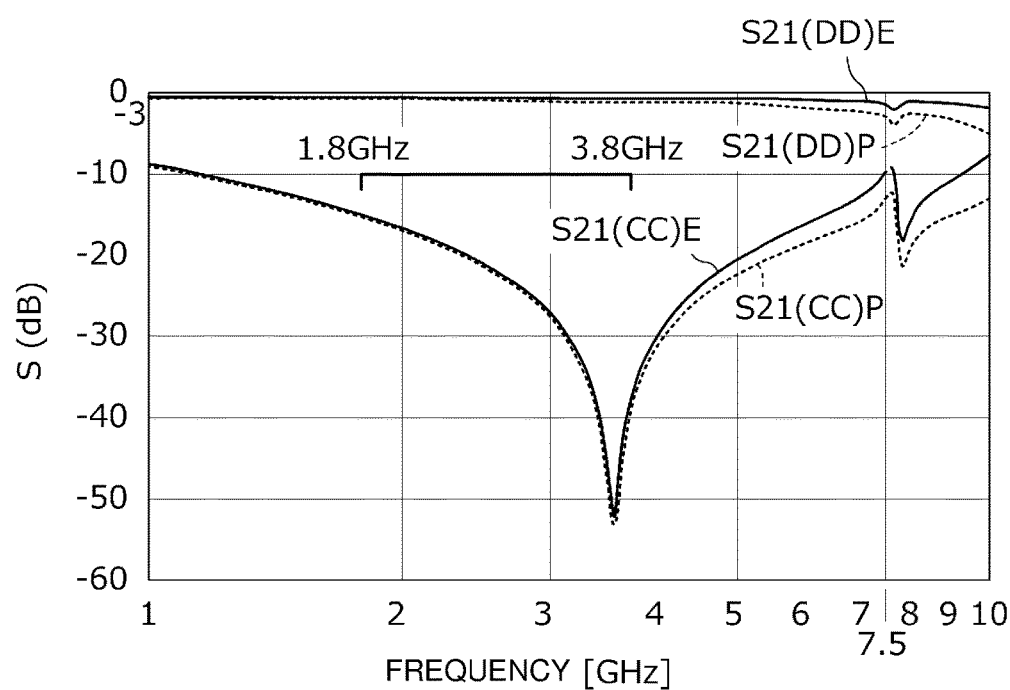
FIG. 19 is a diagram illustrating insertion loss characteristics of the composite device 310D according to the fourth preferred embodiment of the present invention and a common-mode filter that is a comparative example.

FIG. 19 is a diagram illustrating insertion loss characteristics of the composite device 310D according to the present preferred embodiment and a common-mode filter that is a comparative example. A common-mode filter that is a comparative example differs from a common-mode filter according to the present preferred embodiment in that the first coil L1, the second coil L2, the third coil L3, and the fourth coil L4 are not included. Referring to FIG. 19, a vertical axis represents an insertion loss and a horizontal axis represents a frequency. An insertion loss S21(CC)E of a common mode signal (noise) in the present preferred embodiment, an insertion loss S21(CC)P of a common mode signal (noise) in the comparative example, an insertion loss S21(DD)E of a differential mode signal in the present preferred embodiment, and an insertion loss S21(DD)P of a differential mode signal in the comparative example are illustrated.

As is apparent from FIG. 19, requirements that a common mode signal (noise) is attenuated by about −10 dB or greater in, for example, a frequency band from about 1.8 GHz to about 3.8 GHz and the insertion loss of a differential mode signal is less than about −3 dB in, for example, a band less than about 7.5 GHz are satisfied.

In the ESD protection circuit 101C according to the above-described preferred embodiment illustrated in FIG. 5, the cathode of the first Zener diode D1 is connected to the first node CN1, the cathode of the second Zener diode D2 is connected to the second node CN2, and the cathode of the third Zener diode D3 is connected to the ground. The orientations of the Zener diodes D1, D2, and D3 may be reversed. In the ESD protection circuit 102C illustrated in FIG. 11, the orientations of the Zener diodes D1 and D2 may be reversed.

The descriptions of the preferred embodiments above are merely illustrative in all respects and are not limiting. Variations and modifications may be made as appropriate. The scope of the present invention is determined in view of the appended claims. Furthermore, equivalents to the appended claims and all modifications of the present invention which fall within the scope of the present invention are intended to be encompassed in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection circuit comprising:
a first terminal and a second terminal defining a first balanced port;
a third terminal and a fourth terminal defining a second balanced port;
a first ESD protection circuit that includes a first Zener diode and is connected between a ground and a first node between the first terminal and the third terminal;
a second ESD protection circuit that includes a second Zener diode, is connected between the ground and a second node between the second terminal and the fourth terminal, and is symmetric with respect to the first ESD protection circuit;
a first coil provided in series between the first terminal and the first node;
a third coil that is cumulatively connected to the first coil and is provided in series between the third terminal and the first node;
a second coil provided in series between the second terminal and the second node; and
a fourth coil that is cumulatively connected to the second coil and is provided in series between the fourth terminal and the second node.

2. The ESD protection circuit according to claim 1, wherein
the first coil and the third coil are provided in a first region where coil openings of the first coil and the third coil at least partially overlap in plan view;
the second coil and the fourth coil are provided in a second region where coil openings of the second coil and the fourth coil at least partially overlap in plan view; and
the first ESD protection circuit and the second ESD protection circuit are provided between the first region and the second region.

3. The ESD protection circuit according to claim 1, further comprising:
a third Zener diode reversely connected to the first Zener diode and the second Zener diode; wherein
the first ESD protection circuit is a series circuit including the first Zener diode and the third Zener diode; and
the second ESD protection circuit is a series circuit including the second Zener diode and the third Zener diode.

4. The ESD protection circuit according to claim 1, wherein
a mutual inductance generated by coupling between the first coil and the third coil has a value by which an inductance component generated at a path of an ESD current flowing through the first ESD protection circuit is canceled; and
a mutual inductance generated by coupling between the second coil and the fourth coil has a value by which an inductance component generated at a path of an ESD current flowing through the second ESD protection circuit is canceled.

5. The ESD protection circuit according to claim 1, wherein a Ni/Au or Ni/Sn plating film is provided on surfaces of the first, second, third, and fourth terminals.

6. A differential transmission line comprising:
a first line and a second line that transmit a differential signal; and
an ESD protection circuit that is connected to the first line and the second line; wherein
the ESD protection circuit includes:
a first terminal and a second terminal defining a first balanced port connected to the first line and the second line;
a third terminal and a fourth terminal defining a second balanced port connected to the first line and the second line;
a first ESD protection circuit that includes a first Zener diode and is connected between a ground and a first node between the first terminal and the third terminal;
a second ESD protection circuit that includes a second Zener diode, is connected between the ground and a second node between the second terminal and the fourth terminal, and is symmetric with respect to the first ESD protection circuit;
a first coil provided in series between the first terminal and the first node;
a third coil that is cumulatively connected to the first coil and is provided in series between the third terminal and the first node;
a second coil provided in series between the second terminal and the second node; and
a fourth coil that is cumulatively connected to the second coil and is provided in series between the fourth terminal and the second node.

7. The differential transmission line according to claim 6, wherein
the first coil and the third coil are provided in a first region where coil openings of the first coil and the third coil at least partially overlap in plan view;

the second coil and the fourth coil are provided in a second region where coil openings of the second coil and the fourth coil at least partially overlap in plan view; and the first ESD protection circuit and the second ESD protection circuit are provided between the first region and the second region.

8. The differential transmission line according to claim 6, further comprising:

a third Zener diode reversely connected to the first Zener diode and the second Zener diode; wherein the first ESD protection circuit is a series circuit including the first Zener diode and the third Zener diode; and the second ESD protection circuit is a series circuit including the second Zener diode and the third Zener diode.

9. The differential transmission line according to claim 6, wherein a mutual inductance generated by coupling between the first coil and the third coil has a value by which an inductance component generated at a path of an ESD current flowing through the first ESD protection circuit is canceled; and a mutual inductance generated by coupling between the second coil and the fourth coil has a value by which an inductance component generated at a path of an ESD current flowing through the second ESD protection circuit is canceled.

10. The differential transmission line according to claim 6, wherein a Ni/Au or Ni/Sn plating film is provided on surfaces of the first, second, third, and fourth terminals.

11. A common mode filter circuit comprising:

a common mode choke coil;

an ESD protection circuit connected to the common mode choke coil;

a first terminal and a second terminal defining a first balanced port;

a third terminal and a fourth terminal defining a second balanced port; and a fifth terminal and a sixth terminal defining a third balanced port; wherein the ESD protection circuit includes:

a first ESD protection circuit that includes a first Zener diode and is connected between a ground and a first node between the first terminal and the third terminal;

a second ESD protection circuit that includes a second Zener diode, is connected between the ground and a second node between the second terminal and the fourth terminal, and is symmetric with respect to the first ESD protection circuit;

a first coil provided in series between the first terminal and the first node;

a third coil that is cumulatively connected to the first coil and is provided in series between the third terminal and the first node;

a second coil provided in series between the second terminal and the second node; and a fourth coil that is cumulatively connected to the second coil and is provided in series between the fourth terminal and the second node; and the common mode choke coil includes:

a fifth coil connected between the third terminal and the fifth terminal; and a sixth coil that is connected between the fourth terminal and the sixth terminal and is coupled to the fifth coil.

12. The common mode filter circuit according to claim 11, wherein the first coil and the third coil are provided in a first region where coil openings of the first coil and the third coil at least partially overlap in plan view;

the second coil and the fourth coil are provided in a second region where coil openings of the second coil and the fourth coil at least partially overlap in plan view; and the first ESD protection circuit and the second ESD protection circuit are provided between the first region and the second region.

13. The common mode filter circuit according to claim 11, further comprising:

a third Zener diode reversely connected to the first Zener diode and the second Zener diode; wherein the first ESD protection circuit is a series circuit including the first Zener diode and the third Zener diode; and the second ESD protection circuit is a series circuit including the second Zener diode and the third Zener diode.

14. The common mode filter circuit according to claim 11, wherein a mutual inductance generated by coupling between the first coil and the third coil has a value by which an inductance component generated at a path of an ESD current flowing through the first ESD protection circuit is canceled; and a mutual inductance generated by coupling between the second coil and the fourth coil has a value by which an inductance component generated at a path of an ESD current flowing through the second ESD protection circuit is canceled.

15. The common mode filter circuit according to claim 11, wherein a Ni/Au or Ni/Sn plating film is provided on surfaces of the first, second, third, fourth, fifth, and sixth terminals.

16. An ESD protection device comprising:

a multilayer body in which a plurality of insulating resin layers are laminated;

a plurality of terminal electrodes provided on a mounting surface of the multilayer body;

an ESD protection semiconductor chip component embedded in the multilayer body to define a diode; and a matching circuit that is provided in the multilayer body and is connected between the ESD protection semiconductor chip component and the plurality of terminal electrodes; wherein the matching circuit includes loop conductor patterns provided in or on the insulating resin layers; and the loop conductor patterns are provided at layers between a layer in which the ESD protection semiconductor chip component is embedded and the mounting surface of the multilayer body.

17. The ESD protection device according to claim 16, wherein the plurality of insulating resin layers are made of polyimide or liquid crystal polymer.

18. A composite device comprising:

a multilayer body in which a plurality of insulating resin layers are laminated;

a plurality of terminal electrodes provided on a mounting surface of the multilayer body;

an ESD protection semiconductor chip component embedded in the multilayer body to define a diode;

a matching circuit that is provided in the multilayer body and is connected between the ESD protection semiconductor chip component and the plurality of terminal electrodes; and a common mode filter circuit that is connected between the matching circuit and the plurality of terminal electrodes and is provided in the multilayer body; wherein the matching circuit includes first loop conductor patterns provided in or on the insulating resin layers;

the common mode filter circuit includes second loop conductor patterns provided in or on the insulating resin layers;

the first loop conductor patterns are provided at layers between a layer in which the ESD protection semiconductor chip component is embedded and the mounting surface of the multilayer body; and the second loop conductor patterns are provided at layers between the layer in which the ESD protection semiconductor chip component is embedded and a surface opposite to the mounting surface of the multilayer body.

19. The composite device according to claim 18, wherein the plurality of insulating resin layers are made of polyimide or liquid crystal polymer.

* * * * *